(12) United States Patent
Eriksson

(10) Patent No.: US 12,402,288 B2
(45) Date of Patent: Aug. 26, 2025

(54) ENCLOSURE

(71) Applicant: Hitachi Energy Ltd, Zürich (CH)

(72) Inventor: Goran Eriksson, Västerås (SE)

(73) Assignee: HITACHI ENERGY LTD, Zurich (CH)

( * ) Notice: Subject to any disclaimer, the term of this patent is extended or adjusted under 35 U.S.C. 154(b) by 0 days.

(21) Appl. No.: 18/853,835

(22) PCT Filed: Mar. 6, 2023

(86) PCT No.: PCT/EP2023/055579
§ 371 (c)(1),
(2) Date: Oct. 3, 2024

(87) PCT Pub. No.: WO2023/194015
PCT Pub. Date: Oct. 12, 2023

(65) Prior Publication Data
US 2025/0113470 A1    Apr. 3, 2025

(30) Foreign Application Priority Data
Apr. 8, 2022  (EP) .................................. 22167475

(51) Int. Cl.
*H05K 9/00* (2006.01)
(52) U.S. Cl.
CPC .................. *H05K 9/0007* (2013.01)
(58) Field of Classification Search
CPC ......... H05K 9/00; H05K 9/0007; H02J 50/10; H01Q 1/256; H01Q 9/26; H01Q 9/28
See application file for complete search history.

(56) References Cited

U.S. PATENT DOCUMENTS 6,553,849 B1 * 4/2003 Scofield ............ G01N 15/0266
702/29
8,780,004 B1    7/2014 Chin
(Continued)

FOREIGN PATENT DOCUMENTS

CN    114157955 A    3/2022
DE    19723644 A1    12/1998
(Continued)

OTHER PUBLICATIONS

International Search Report and Written Opinion of the International Searching Authority, International Application No. PCT/EP2023/055579, mailed May 22, 2023, 12 pages.
(Continued)

*Primary Examiner* — Thien M Le
(74) *Attorney, Agent, or Firm* — Sage Patent Group

(57) ABSTRACT

The present disclosure relates to an enclosure for an electric device in a high voltage electric field, the enclosure including at least one top element and at least one corresponding bottom element extending circumferentially from a center portion, wherein the top and the bottom elements are plate-like elements disposed substantially parallel to each other at a predetermined distance to provide a space therebetween. The top and bottom elements are each electrically connected at one end at the center portion, and in electrical contact at respective circumferential ends to form at least a portion of the enclosure. The enclosure is at least partially constructed of a conductive material. At least two slots are provided in the enclosure extending from the center portion to a circumference to separate different portions of the enclosure.

13 Claims, 5 Drawing Sheets

(56) References Cited

U.S. PATENT DOCUMENTS

| | | | |
|---|---|---|---|
| 9,672,978 B2 | 6/2017 | Fujieda | |
| 10,448,538 B1* | 10/2019 | Gaul | H05K 7/20154 |
| 2005/0205561 A1* | 9/2005 | Keishima | H05B 6/1209 |
| | | | 219/621 |
| 2012/0262826 A1* | 10/2012 | Gillard | H05K 7/1495 |
| | | | 29/829 |
| 2015/0162129 A1 | 6/2015 | Fujieda | |
| 2016/0047061 A1* | 2/2016 | Huang | D04H 1/736 |
| | | | 264/468 |
| 2019/0021184 A1* | 1/2019 | Williams | F04D 29/441 |
| 2020/0098698 A1* | 3/2020 | Patten | H01L 23/3128 |
| 2023/0110535 A1* | 4/2023 | Ishizawa | H01J 47/12 |
| | | | 250/390.12 |
| 2024/0307081 A1* | 9/2024 | Batchelder | A61B 17/22022 |

FOREIGN PATENT DOCUMENTS

| | | |
|---|---|---|
| JP | H0265321 U | 5/1990 |
| JP | 2009-170627 A | 7/2009 |
| JP | 2012134374 A | 7/2012 |
| JP | 2019186610 A | 10/2019 |
| WO | 2013/061615 A1 | 5/2013 |
| WO | 2014/006711 A1 | 1/2024 |

OTHER PUBLICATIONS

Extended European Search Report, European Application No. 22167475.7, mailed Oct. 31, 2022, 6 pages.

Japanese Office Action and English translation, Japanese Patent Application No. 2024-558412, mailed Feb. 8, 2025, 3 pages.

First Office Action, Chinese Invention Patent Application No. 2023800328282, mailed May 28, 2025, 7 pages.

* cited by examiner

ENCLOSURE

CROSS-REFERENCE TO RELATED APPLICATIONS

This application is a 35 U.S.C. § 371 national stage application of PCT International Application No. PCT/EP2023/055579 filed on Mar. 6, 2023, which in turn claims priority to European Patent Application No. 22167475.7, filed on Apr. 8, 2022, the disclosures and content of which are incorporated by reference herein in their entireties.

TECHNICAL FIELD

The present disclosure relates to an enclosure for an electric device in a high voltage electric field. In particular, the disclosure is related to a multi-functional shielding enclosure for wireless devices in high-voltage environments.

BACKGROUND

The use of wireless transfer of data and power in high-voltage installations is increasing as a consequence of the introduction of more sensors and remote control systems. Often this involves placing small devices containing electronics and radio transmitters, or receivers, in a very harsh electromagnetic environment. Some examples may include power transformers, substations, and HVDC converter stations. In particular, exceedingly high electric fields may interfere with the electronics or cause local discharges to occur due to field enhancement at the surface of the inserted devices. Some kind of field grading and electric shielding of the electronics is therefore required. Complete shielding is, however, not desired since wireless power transfer to the electronics is needed when wires cannot be used in the strong electric field environment. The shielding enclosure thus has to be permeable to the magnetic field used for the power transfer. An additional problem is to design an antenna that allows data communication at high frequencies to and from the device. Having the antenna element placed outside the shielding enclosure will inevitably increase the risk for strong field enhancement and, consequently, local discharges to occur.

It is therefore a need to fulfil at least one of the following requirements:
- Efficiently shielding an external, e.g., 50/60 Hz, AC electric field and at the same time minimizing the field enhancement just outside the enclosure.
- Allowing the externally imposed magnetic field (e.g., typical frequencies in the MHz range) used for the wireless power transfer to reach the interior of the enclosure, where a pick-up coil is placed.
- Having a design such that the enclosure itself can also be used as the antenna element for high-frequency (e.g., GHz range) data communication.

SUMMARY

The present disclosure relates to an enclosure. Various exemplary embodiments of the present disclosure disclosed herein are directed to providing features that will become readily apparent by reference to the following description when taken in conjunction with the accompanying drawings. In accordance with various embodiments, exemplary systems, methods, and devices are disclosed herein. It is understood, however, that these embodiments are presented by way of example and not limitation, and it will be apparent to those of ordinary skill in the art who read the present disclosure that various modifications to the disclosed embodiments can be made while remaining within the scope of the present disclosure.

Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

The above and other aspects and their implementations are described in greater detail in the drawings, the descriptions, and the claims.

DETAILED DESCRIPTION

Figure 1:
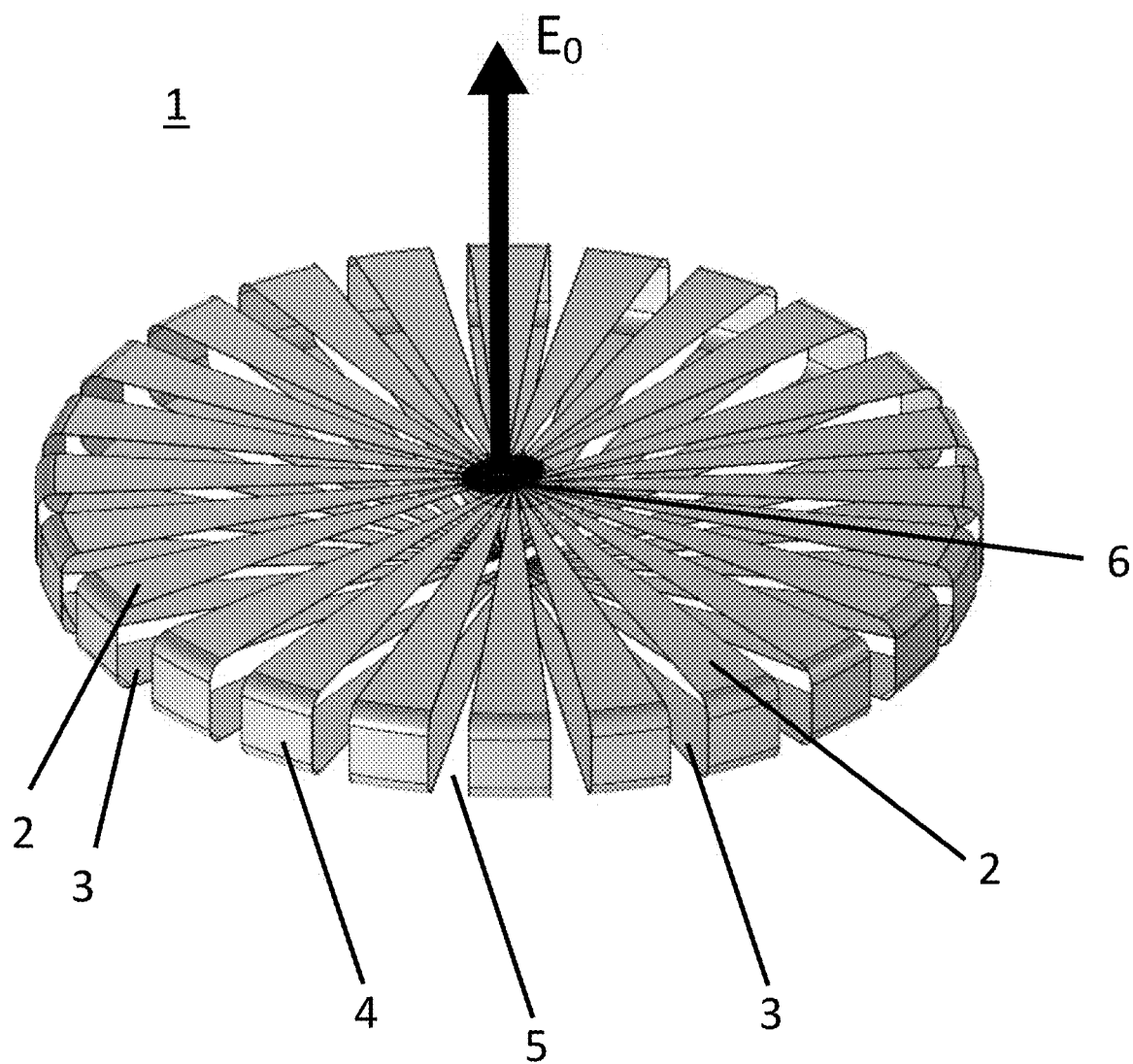
FIG. 1 shows a perspective view of an example of an enclosure according to the present disclosure.

In the following, exemplary embodiments of the disclosure will be described. It is noted that some aspects of any one of the described embodiments may also be found in some other embodiments unless otherwise stated or obvious. However, for increased intelligibility, each aspect will only be described in detail when first mentioned and any repeated description of the same aspect will be omitted.

The present disclosure relates to an enclosure for an electric device in a high voltage electric field, the enclosure comprising at least one top element and at least one corresponding bottom element extending circumferentially from a center portion, wherein the top and the bottom elements are plate-like elements disposed substantially parallel to each other at a predetermined distance to provide a space therebetween. The top and bottom elements are each electrically connected at one end at the center portion, and in electrical contact at respective circumferential ends to form at least a portion of the enclosure. The enclosure is at least partially constructed of a conductive material. At least two slots are provided in the enclosure extending from the center portion to a circumference to separate different portions of the enclosure.

Various embodiments may particularly implement the following features.

The top and bottom elements may be configured to be oriented substantially perpendicular to a direction of the electric field.

The enclosure may be configured to allow wireless power transmission to the space.

The enclosure may be split in two parts at the center portion. An antenna feeding circuit may be connected to both parts of the enclosure.

The top element and the bottom element may be connected by a connecting portion at the circumference of the top and bottom element. Particularly, the top element, the bottom and the connecting portion are integrally formed.

The slots may be symmetrically provided with respect to the center portion.

The top element and the bottom element forming the portion of the enclosure may form a circular sector around the center portion. A radius of the top element and the bottom element may particularly be between 5 mm and 75 mm. A distance between the top element and the bottom element may particularly be between 5 mm and 15 mm.

The top element, the bottom element and the connecting portion may comprise a respective thickness and a respective conductivity.

The space may be at least partially filled with a dielectric and insulating material.

An opening may be provided in the enclosure to enable inserting an electronic device.

The enclosure may comprise an electrically conductive layer.

A width of the slots at the circumference of the disclosure may be less than 25% of a distance between the top element and the bottom element.

A distance between the slots at the circumference of the disclosure may be equal to or smaller than a distance between the top element and the bottom element.

A width of the slots may gradually increase from the center portion towards the circumference.

In the following, it is assumed that the main direction of the AC electric field of the power transformer, substation, HVDC converter station or similar is well-known, such that the plane of the enclosure can be oriented substantially perpendicular to the electric field. In this way, the field enhancement at the surface of the enclosure will be minimized.

FIG. 1 shows an exemplary enclosure according to the present disclosure. The enclosure 1 comprises at least one top element 2 and at least one corresponding bottom element 3 extending circumferentially from a center portion 6. The top and the bottom elements 2, 3 are plate-like elements disposed substantially parallel to each other at a predetermined distance to provide a space therebetween. The top and bottom elements 2, 3 are each electrically connected at one end at the center portion 6, and in electrical contact at respective circumferential ends to form at least a portion of the enclosure 1. However, the top and bottom elements 2 and 3 are not required to be in contact with each other at the center portion 6. In other words, there may be no direct connection between top element 2 and bottom element 3 at the center portion. The enclosure 1 is at least partially constructed of a conductive material. At least two slots 5 are provided in the enclosure 1 extending from the center portion 6 to a circumference to separate different portions of the enclosure 1. In FIG. 1, $E_0$ marks the direction of an electrical field. The overall shape of the enclosure 1 may be described as flat pill-box shaped.

The top element 2 and the bottom element 3 may be connected by a connecting portion 4 at the circumference of the top and bottom element 2, 3, respectively. The top element 2, the bottom element 3 and the connecting portion 4 may be integrally formed.

In other words, the enclosure 1 for an electric device in a high voltage electric field may comprise a top element 2 and a bottom element 3 having a rounded shape, wherein the top element 2 and the bottom element 3 are plate-like elements disposed parallel to each other. Top element 2 and bottom element 3 may be connected by a connecting portion 4 at a circumference of the top element 2 and the bottom element 3, respectively, to provide a space therebetween and to form the enclosure 1. The enclosure 1 may be at least partially constructed of a conductive material and at least two slots 5 may be provided in the enclosure 1 from a center portion 6 to the circumference to form portions or segments of the enclosure 1, wherein the center portion 6 of the top and bottom elements 2, 3 electrically connects the portions.

The overall shape of the enclosure 1 may particularly be curved or rounded, such as an oval shape or circular shape, in order to avoid disadvantageous effects of sharp corners on the shielding performance.

Particularly in use, the top and bottom elements 2, 3 may be configured to be oriented substantially perpendicular to a direction of the electric field. Thereby, electric shielding of the space may be achieved. Moreover, the enclosure 1 may be configured to allow wireless power transmission to the space inside the enclosure 1.

Electric shielding of the interior space of the enclosure 1 is achieved even for other relative directions of the enclosure 1 and the electric field. However, if they are not perpendicular to each other, significant field enhancement at the outside surface of the enclosure might occur.

The top element 2, the bottom element 3 and the connecting portion 4 may comprise a respective thickness d and a respective conductivity σ, wherein a product of thickness d and conductivity σ is particularly smaller than 5 $1/\Omega$, i.e., 5 S. In principle, the attenuation of the electric field inside the enclosure 1 (i.e., the Faraday cage effect) is not affected by the orientation, as long as the product σ d is sufficiently large, $\sigma d > 10^{-9}$ S. However, the field enhancement just outside the enclosure surface is affected by said orientation. If this field enhancement is too large, this could lead to the occurrence of local discharges there. By orienting the enclosure such that the external electric field is perpendicular to the flat surfaces of the enclosure, the field enhancement is minimised.

An opening may be provided in the enclosure 1 to enable inserting an electronic device. The electronic device may e.g., be configured to provide operational data or control signals of/to a power transformer, substation, HVDC converter station or similar to which the enclosure 1 is attached or in whose vicinity the enclosure is located.

Figure 2:
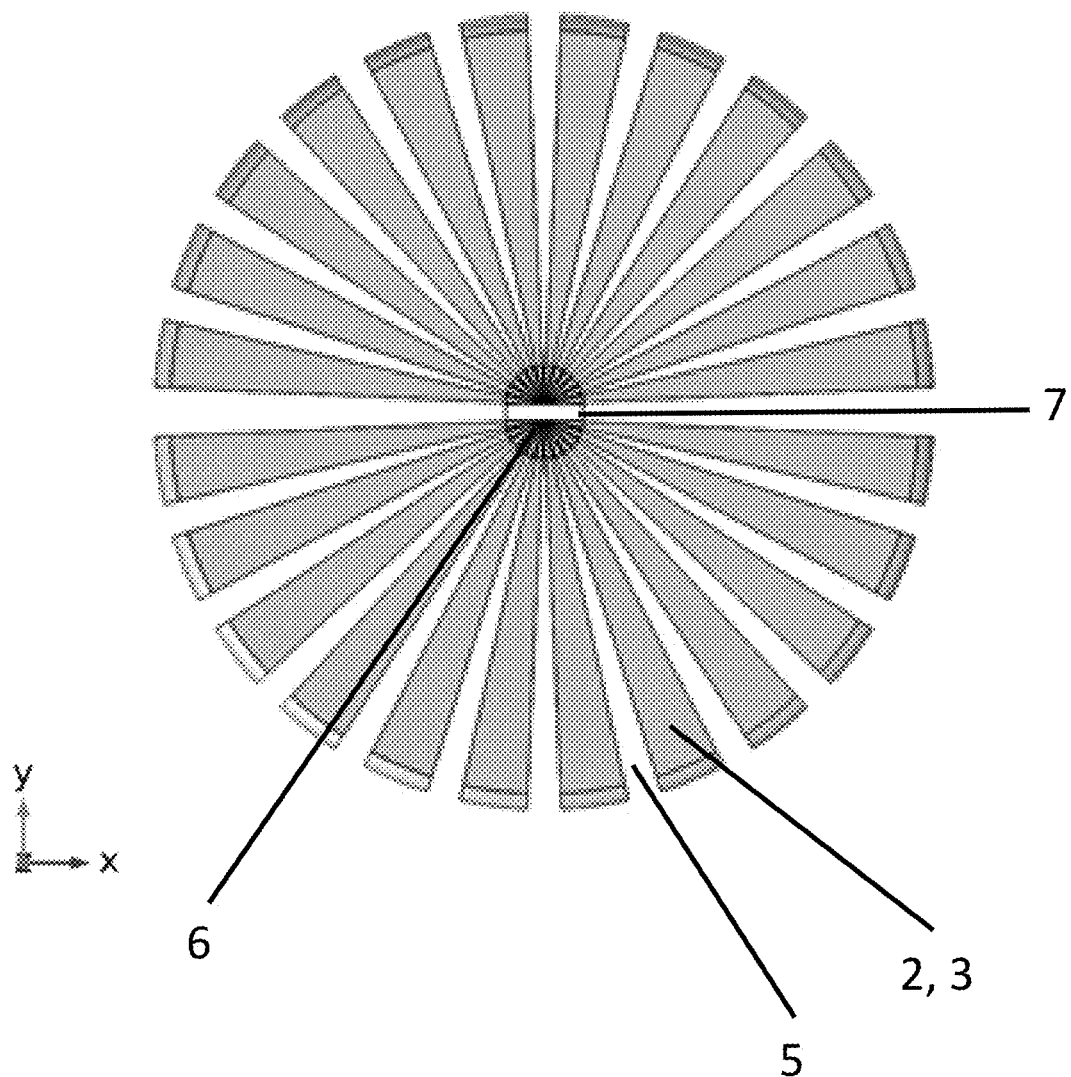
FIG. 2 shows a plan view of an example of an enclosure according to the present disclosure comprising an antenna feeding circuit.

The enclosure 1 may be split in two parts at the center portion 6 as shown in FIG. 2. An antenna feeding circuit 7 may be connected to both parts of the enclosure 1. In this manner, the enclosure may additionally work as an antenna for communicating, e.g., the operational data or control signals of a power transformer, substation, HVDC converter station from the electronic device via the enclosure 1.

Also, the presence of a gap as shown in FIG. 2 where the antenna feeding circuit 7 is installed (required for the GHz antenna functionality) requires the flat surfaces of the top and bottom elements 2, 3 to be perpendicular to the electric field. For other orientations there might occur a strong electric field in the gap region.

The slots 5 may be symmetrically provided with respect to the center portion 6. The top element 2 and the bottom element 3 forming the portion of the enclosure 1 may form a circular sector around the center portion 6. In an example, a radius of the top element 2 and the bottom element 3 is between 5 mm and 75 mm. Assuming a circular shaped enclosure 1, the diameter thereof may be between 10 mm and 150 mm. In an example, a distance between the top element 2 and the bottom element 3 is between 5 mm and 15 mm.

The space, i.e., the space between top and bottom elements 2, 3, may be at least partially filled with a dielectric and insulating material.

The enclosure 1 may comprise an electrically conductive layer. That is, the enclosure 1 may be coated with an electrically conductive layer.

In an example, a width of the slots 5 at the circumference of the disclosure is less than 25% of a distance between the top element 2 and the bottom element 3. In an example, a distance between the slots 5 at the circumference of the disclosure is equal to or smaller than a distance between the top element 2 and the bottom element 3.

A width of the slots 5 may gradually increase from the center portion 6 towards the circumference.

The exemplary enclosure 1 described with reference to FIGS. 1 and 2 will be explained in more detail with respect to the above-mentioned requirements. The (pill-box shaped, i.e., circular) enclosure 1 which forms the basis of the following simulations and computations has a diameter of 100 mm and thickness of 10 mm. Typically, the diameter lies in the range 10 mm to 150 mm and the thickness varies between 5 mm and 15 mm. The electronics is positioned in the interior of the enclosure, which is filled with a dielectric and insulating material to provide mechanical support for the conducting enclosure layers. However, the above values and ranges are only of exemplary nature and the present disclosure is not limited thereto.

The following regards electric shielding of the inside. Low-frequency electric shielding of the interior may be achieved by using a Faraday cage type of conducting enclosure 1. In the illustrating example shown in FIG. 1, the cage of the enclosure 1 consists of a thin conducting layer partly covering the surface of the enclosure 1. Here, the product of the layer conductivity 6 and the thickness d has to be large enough to reduce the electric field level inside the enclosure 1 to an acceptable level. Typically, $\sigma$ d should be larger than $10^{-9}$ S ($10^{-9}$ 1/$\Omega$). Moreover, the product $\sigma$ d should be smaller than 5 S (i.e., 5 1/$\Omega$), particularly smaller than 1 S. The small layer surface, i.e., the center portion 6 close to the symmetry axis, electrically connects the different parts of the enclosure 1, i.e., the respective top elements 2 and bottom elements 3, which further improves the shielding of the non-axial E-field components and provides some mechanical stability.

Figure 3:
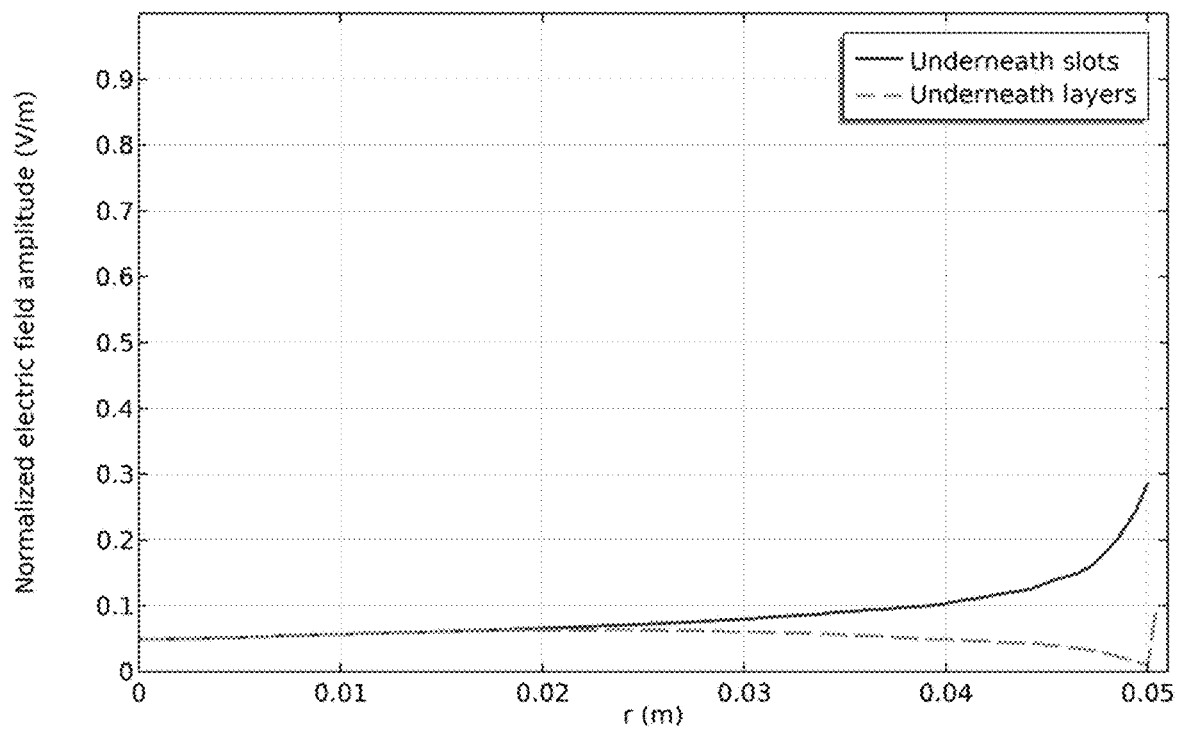
FIG. 3 shows a normalised electric field amplitude in an exemplary enclosure according to the present disclosure in an electric field.

FIG. 3 illustrates the shielding effect of the enclosure 1. In this simulation, an $E_0$=1 V/m external electric field is assumed. Significant shielding is obtained even with a relatively low value of layer conductivity $\sigma$. It is also seen that the shielding efficiency is not homogeneous inside the enclosure 1. In particular, FIG. 3 shows a plot of an E-field amplitude along two radial lines in the horizontal plane, underneath the conducting layer, i.e., between a top element 2 and a bottom element 3, and underneath a slot 5, respectively. In particular, the graph shows the normalised electric field amplitude (V/m) dependent on the radius r (m) underneath slots (continuous line) and underneath layers, i.e., the portions as explained above (dashed line).

As can be seen from the graph, the exemplary enclosure 1 provides significant reduction of the electric field, particularly below the portions but also within the slots.

The following regards the requirement of allowing a magnetic field to pass through to the space inside the enclosure 1 in order to provide wireless power transfer.

The efficiency of the wireless power transfer may be optimised when: (i) the imposed magnetic field is perpendicular to the plane of the pick-up coil, and (ii) the area of a planar pick-up coil, e.g., of an electronic device placed inside the enclosure 1 and requiring power, is as large as possible. These two conditions are fulfilled when the internal pick-up coil is in the plane of the enclosure 1 and the magnetic field is perpendicular to the same plane. This implies in our case that optimised power transfer is obtained when the imposed magnetic field is parallel to the strong external electric field.

Due to the shielding effect of the induced currents in the conducting enclosure layer, the amplitude of the magnetic field will, however, be reduced inside the enclosure. To achieve efficient power transfer, it is consequently necessary to somehow counteract the generation of the induced currents. One way to do this is to cut slots 5 in the conducting enclosure 1 layer as described above. By orienting the slots 5 to be everywhere perpendicular to the direction of the otherwise induced currents, the amplitude of these currents, and the damping of the magnetic field, will be drastically reduced. In the case of a pill-box shaped enclosure 1 without slots, the induced current will circulate in the angular direction around the symmetry axis of the enclosure (which is parallel to the imposed magnetic field). Radial slots 5 are therefore introduced to hinder the induced currents and thus to allow the magnetic field to penetrate the enclosure 1 (the small surface close to the symmetry axis, i.e., the center portion 6, does not have a significant impact). The example design in FIGS. 1 and 2 illustrates how such slots can be introduced in the enclosure layer. Note that these slots do not break the electrical connection between the upper and lower planar surfaces of the enclosure 1. This is important for the electric shielding to work as outlined above.

Figure 4:
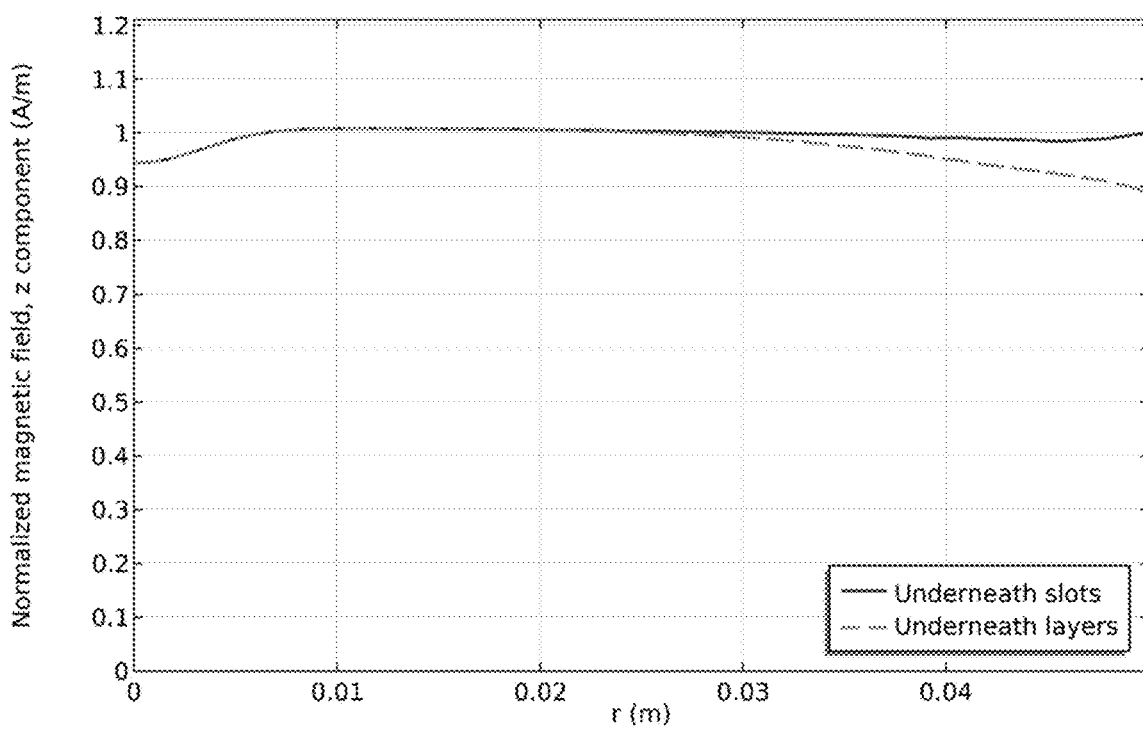
FIG. 4 shows a normalised magnetic field component in an exemplary enclosure according to the present disclosure in an electric field.

In the simulations shown in FIG. 4, it is assumed that the imposed vertical magnetic field has amplitude $|H_z|$=1 A/m and is oscillating with a frequency of f=13 MHz. Again, the product of layer thickness and conductivity is taken to be $\sigma$ d=5 S. The vertical component of the magnetic field on a horizontal plane through the center of the enclosure 1 is shown in FIG. 4 along two radial lines. The graph of FIG. 4 shows the normalised magnetic field over the radius, wherein the continuous line shows the magnetic field underneath the slots 5 and the dashed line shows the magnetic field underneath the layers, i.e., the portions. The overall damping appears to be suitable for wireless power transfer.

The following regards the requirement of providing an antenna functionality. Since the enclosure 1 layer is electrically conducting, it can be used as an antenna element. The simplest way to achieve this is to make it an electric dipole radiator. This is done by cutting the (pill-box shaped) enclosure 1 into two halves at the center portion 6 and connect the halves in the center portion 6 via an antenna feeding circuit 7 as shown in FIG. 2 and explained above. This will create a dipole antenna connected to the feeding circuit 7. For wavelengths longer than the size of the enclosure 1, i.e., the diameter in this example, the radiated power will be omnidirectionally distributed, except for directions close to the direction of the dipole moment. At shorter wavelengths significant directional dependencies will occur.

It should be pointed out that the gap generated when splitting the enclosure 1 has no impact on neither the desired electric shielding nor the magnetic field penetration.

In the above example the two halves are created by a cut through the center portion 6 as shown in FIG. 2. The direction of the antenna feeding circuit 7 between the two halves is in the y-direction, which will then also be the direction of the dipole moment of the antenna. Solving for the near-field and then performing a near-to-far-field transformation yields the radiation pattern displayed in FIGS. 5 to 7. Again, σ d=5 S is assumed for the simulation. The frequency is assumed to be 2.4 GHz. The quantity shown is the radiated power (in dB), i.e., how much the radiated power density varies as function of direction. It is observed that the radiated power is fairly evenly distributed, except for in the directions of the dipole moment of the antenna, i.e., along the y-axis.

Figure 5:
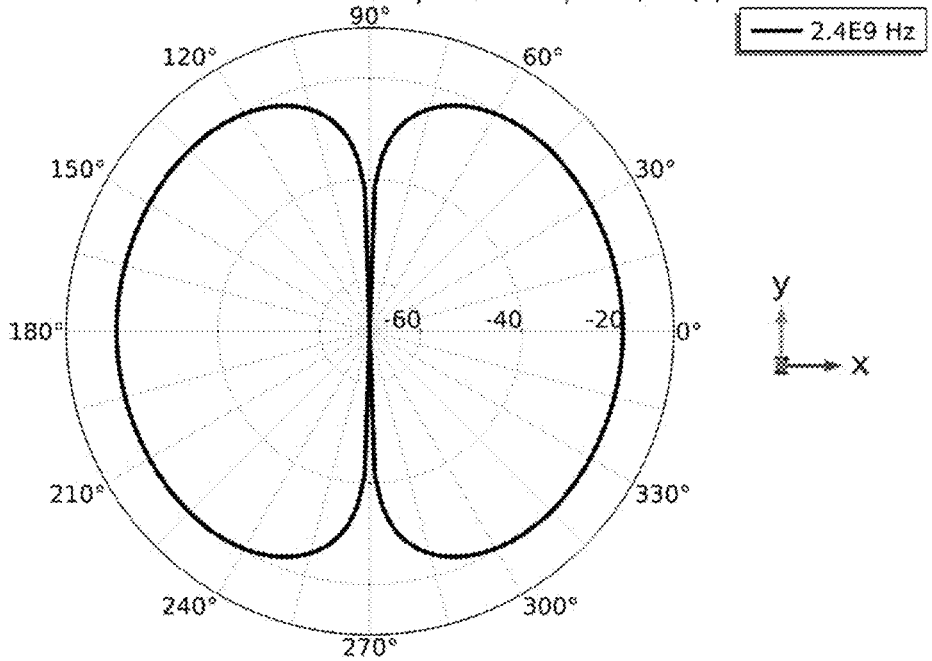
FIGS. 5, 6, and 7 show a radiation pattern of an enclosure according to FIG. 2 in three respective planes.
Figure 6:
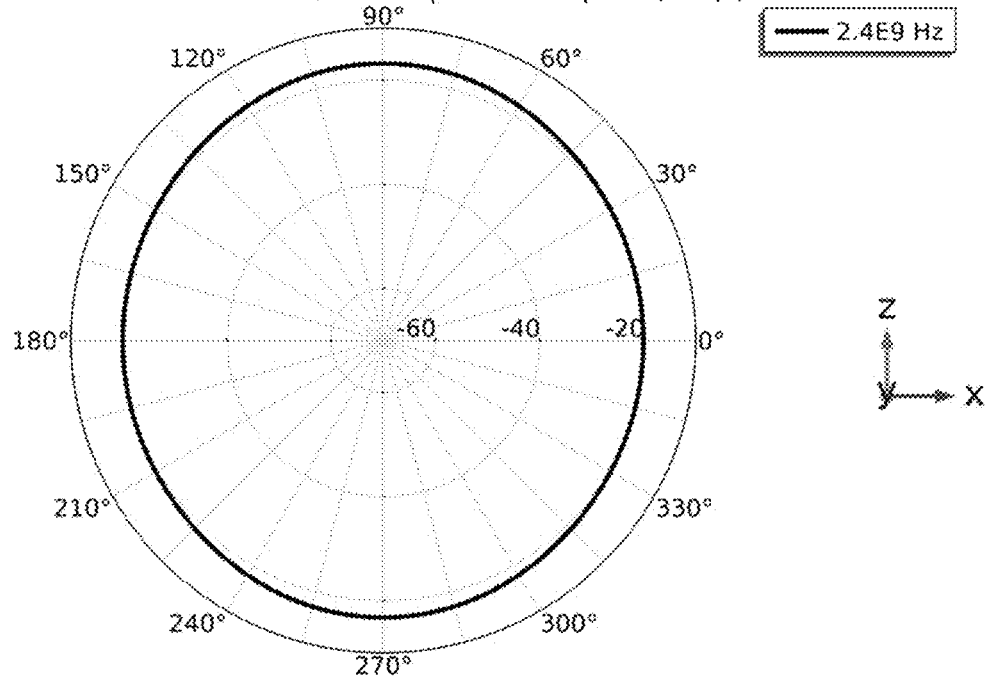
Figure 7:
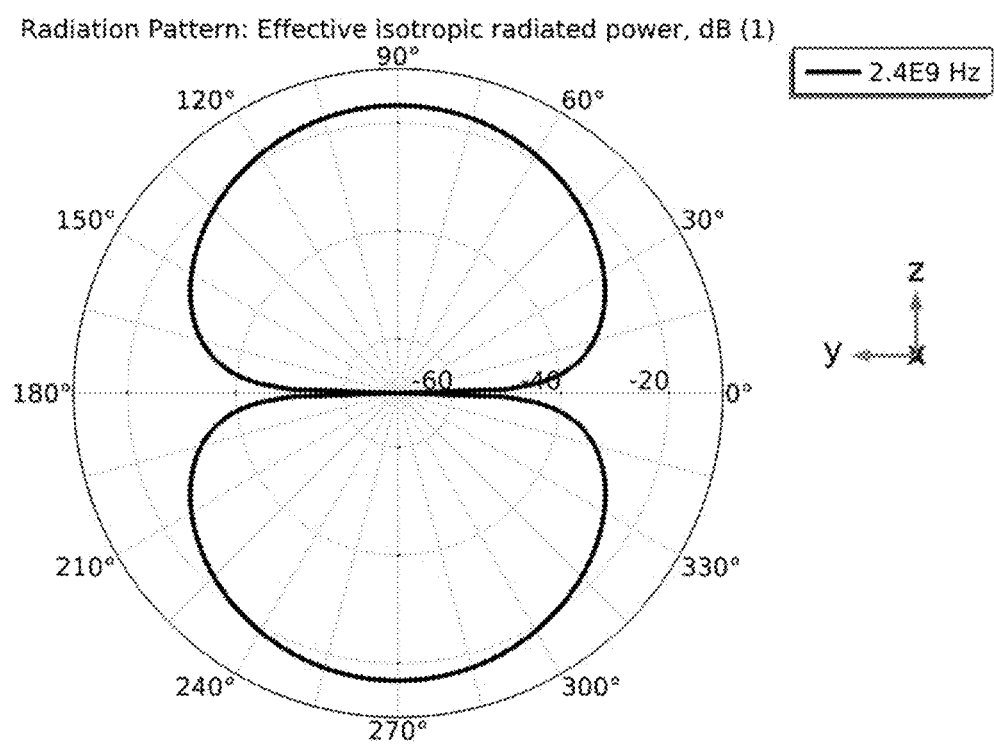

FIGS. 5 to 7 show the radiated power as two-dimensional plots in the x-y plane (FIG. 5), x-z plane (FIG. 6) and y-z plane (FIG. 7).

According to the present disclosure, it is possible to design an enclosure that will strongly damp the external electric field while at the same time allow the magnetic field used for wireless power transfer to penetrate. In addition, the enclosure can serve as the elements of a dipole antenna for communication with external devices. By careful design these three functionalities can be introduced without interfering with each other. Hence, the above mentioned features and functionalities may be combined in a compact design, the enclosure can be used for a wide range of frequencies and a very robust product in terms of electrical, thermal, and mechanical properties can be provided.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Furthermore, in the claims the word "comprising" does not exclude other elements or steps, and the indefinite article "a" or "an" does not exclude a plurality. A single unit may fulfil the functions of several features recited in the claims. The terms "essentially", "about", "approximately" and the like in connection with an attribute or a value particularly also define exactly the attribute or exactly the value, respectively. Any reference signs in the claims should not be construed as limiting the scope.

The invention claimed is:

1. An enclosure for an electric device in a high voltage electric field, the enclosure comprising:
   at least one top element and at least one corresponding bottom element extending circumferentially from a center portion, wherein the top and the bottom elements are plate-like elements disposed substantially parallel to each other at a predetermined distance to provide a space therebetween,
   wherein the top and bottom elements are each electrically connected at one end at the center portion, and in electrical contact at respective circumferential ends to form at least a portion of the enclosure;
   wherein the enclosure is at least partially constructed of a conductive material; and
   wherein at least two slots are provided in the enclosure extending from the center portion to a circumference to separate different portions of the enclosure; and
   wherein the top and bottom elements are configured to be oriented substantially perpendicular to a direction of the electric field.

2. The enclosure according to claim 1, wherein the enclosure is configured to allow wireless power transmission to the space.

3. The enclosure according claim 1, wherein the enclosure is split in two parts at the center portion, and
   wherein an antenna feeding circuit is connected to both parts of the enclosure.

4. The enclosure according to claim 1, wherein the top element and the bottom element are connected by a connecting portion at the circumference of the top and bottom element, wherein particularly the top element, the bottom element and the connecting portion are integrally formed.

5. The enclosure according to claim 1, wherein the slots are symmetrically provided with respect to the center portion.

6. The enclosure according to claim 1, wherein the top element and the bottom element forming the portion of the enclosure form a circular sector around the center portion,
   wherein a radius of the top element and the bottom element is particularly between 5 mm and 75 mm, and/or
   wherein a distance between the top element and the bottom element is particularly between 5 mm and 15 mm.

7. The enclosure according to claim 1, wherein the top element, the bottom element and the connecting portion comprise a respective thickness and a respective conductivity.

8. The enclosure according to claim 1, wherein the space is at least partially filled with a dielectric and insulating material.

9. The enclosure according to claim 1, wherein an opening is provided in the enclosure to enable inserting an electronic device.

10. The enclosure according to claim 1, wherein the enclosure comprises an electrically conductive layer.

11. The enclosure according to claim 1, wherein a width of the slots at the circumference of the disclosure is less than 25% of a distance between the top element and the bottom element.

12. The enclosure according to claim 1, wherein a distance between the slots at the circumference of the disclosure is equal to or smaller than a distance between the top element and the bottom element.

13. The enclosure according to claim 1, wherein a width of the slots gradually increases from the center portion towards the circumference.

* * * * *